(12) United States Patent
Soss et al.

(10) Patent No.: US 8,709,882 B2
(45) Date of Patent: Apr. 29, 2014

(54) METHOD TO DYNAMICALLY TUNE PRECISION RESISTANCE

(75) Inventors: Steven R. Soss, Monroe, NY (US); Andreas Knorr, Wappingers Falls, NY (US)

(73) Assignee: GlobalFoundries Inc., Grand Cayman (KY)

( * ) Notice: Subject to any disclaimer, the term of this patent is extended or adjusted under 35 U.S.C. 154(b) by 649 days.

(21) Appl. No.: 12/683,759

(22) Filed: Jan. 7, 2010

(65) Prior Publication Data

US 2011/0163417 A1    Jul. 7, 2011

(51) Int. Cl.
*H01L 21/00* (2006.01)

(52) U.S. Cl.
USPC .......................................... 438/151; 438/384

(58) Field of Classification Search
USPC .................................. 438/151, 384
See application file for complete search history.

(56) References Cited

U.S. PATENT DOCUMENTS

| | | | | |
|---|---|---|---|---|
| 2005/0124099 | A1* | 6/2005 | Beintner et al. | 438/164 |
| 2008/0265290 | A1* | 10/2008 | Nielsen et al. | 257/288 |
| 2009/0108351 | A1* | 4/2009 | Yang et al. | 257/347 |

* cited by examiner

*Primary Examiner* — Richard Booth
(74) *Attorney, Agent, or Firm* — Ditthavong Mori & Steiner, P.C.

(57) ABSTRACT

A precision resistor is formed with a controllable resistance to compensate for variations that occur with temperature. An embodiment includes forming a resistive semiconductive element having a width and a length on a substrate, patterning an electrically conductive line across the width of the resistive semiconductive element, but electrically isolated therefrom, and forming a depletion channel in the resistive semiconductive element under the electrically conductive line to control the resistance value of the resistive semiconductive element. The design enables dynamic adjustment of the resistance, thereby improving the reliability of the resistor or allowing for resistance modification during final packaging.

8 Claims, 4 Drawing Sheets

US 8,709,882 B2

METHOD TO DYNAMICALLY TUNE PRECISION RESISTANCE

TECHNICAL FIELD

The present disclosure relates to semiconductor devices with precision resistors. The present disclosure is particularly applicable to semiconductors with resistors having dynamically controllable resistance.

BACKGROUND

A key problem with a precision resistor is that the resistance values tend to change over time as a function of temperature. This variation in resistance hinders circuits which rely on precise control of the resistance value for their functionality. Current methods rely on material innovations to limit the thermal coefficient of resistance (TCR) of the resistor and on tolerances built into integrated circuit (IC) designs. However, these approaches do not achieve the high precision required as device dimensions continue to shrink.

A need therefore exists for methodology enabling control of the resistance of a precision resistor.

SUMMARY

An aspect of the present disclosure is a resistive semiconductive element with improved resistance.

Another aspect of the present disclosure is a method of fabricating a resistive semiconductive element with improved resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a resistor comprising: forming a resistive semiconductive element having a width and a length on a substrate; patterning an electrically conductive line across the width of the resistive semiconductive element, but electrically isolated therefrom; and forming a depletion channel in the resistive semiconductive element under the electrically conductive line to control the resistance value of the resistive semiconductive element.

Aspects of the present disclosure include forming the depletion channel by applying a bias voltage to the electrically conductive line to form a high resistance in series with the resistive semiconductor element. Another aspect includes forming a dielectric layer, at a thickness of about 10 nm to about 20 nm, between the resistive semiconductive element and the electrically conductive line, and forming the depletion channel at a width of about 10 nm or less. A further aspect includes applying a bias voltage of about 0.8 V to about 5 V. Additional aspects include forming the resistive semiconductive element by patterning a polycrystalline gate line, and patterning the electrically conductive line by self aligning a contact layer to the gate line. Another aspect includes patterning the electrically conductive line as a separate gate wire. Other aspects include forming a first metal pattern over a substrate, and patterning the electrically conductive line while forming the first metal pattern. Further aspects include dynamically applying a bias voltage to dynamically tune the resistance. Another aspect includes forming the electrically conductive line with a width of about 20 nm to about 40 nm along the length of the resistive semiconductive element Another aspect of the present disclosure is a resistor comprising: a resistive semiconductive element having a width and a length over a substrate; an electrically conductive line across the width of the resistive semiconductive element, but electrically isolated therefrom; and a depletion channel in the resistive semiconductive element under the electrically conductive line to control the resistance value of the resistive semiconductive element.

Aspects include a circuit to apply a fixed control voltage to the conducting line. Another aspect includes a comparator circuit to dynamically apply a voltage to the electrically conductive line to compensate for changes in the resistance of the resistive semiconductive element. Another aspect includes the ability to fix the voltage on the electrically conductive line post final test in order to tune the resistance value of the resistor. Further aspects include a dielectric layer between the resistive semiconductive element and the electrically conductive line, the dielectric layer having a thickness of about 10 nm to about 20 nm, and the depletion channel having a width of about 10 nm or less. An additional aspect includes a resistor including a resistive semiconductive element patterned in a polycrystalline gate line. Other aspects include a self-aligned stop layer between the resistive semiconductor element and the electrically conductive line, wherein the electrically conductive line is a contact layer self-aligned to the gate line. Another aspect includes an electrically conductive line that is a separate gate wire. A further aspect includes an electrically conductive line that is part of a metal 1 pattern. Another aspect includes an electrically conductive line, along the length of the resistive semiconductive element, with a width about 20 nm to about 40 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of resistance varying with temperature in precision resistors. In accordance with embodiments of the present disclosure, a control wire is formed across a resistor and a control voltage is applied thereto. Consequently, a depletion channel is formed in the resistor, thereby establishing a compensation resistance in series with the resistor.

Methodology in accordance with embodiments of the present disclosure includes forming a control wire across a precision resistor and applying a bias voltage to control the overall resistance.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
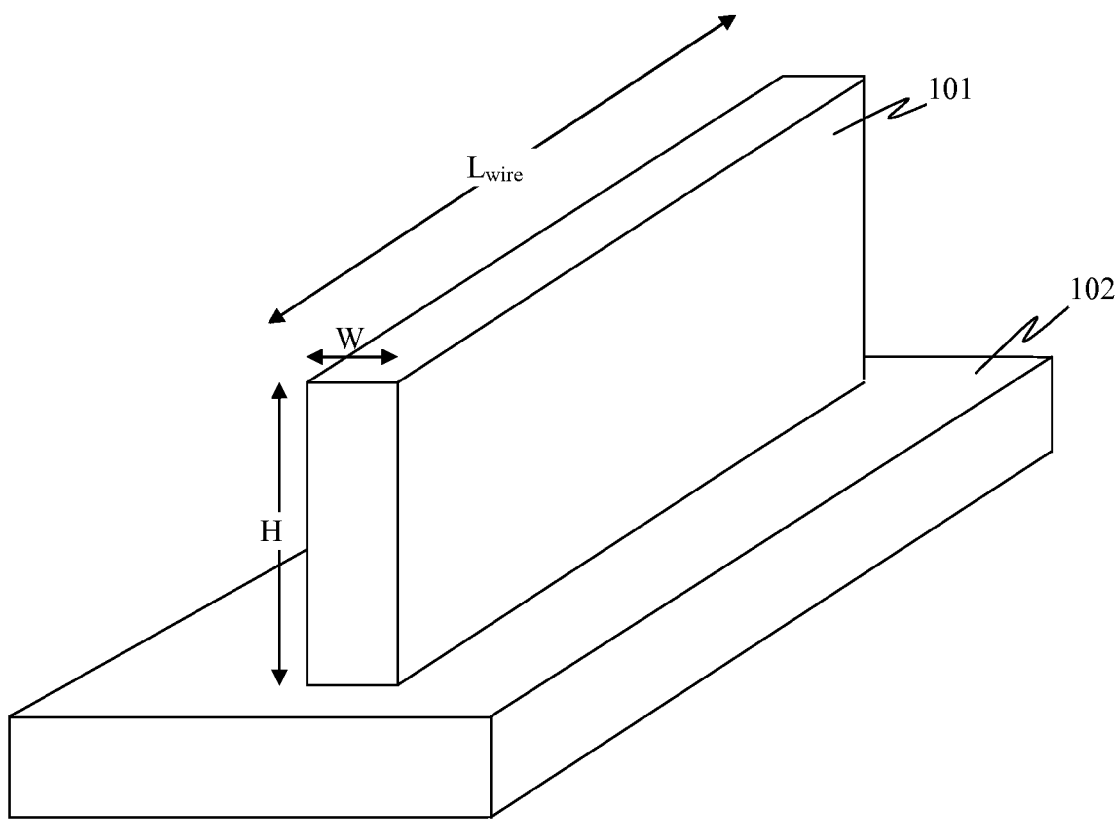
FIGS. 1A through 1D schematically illustrate a process flow for forming a precision resistor in accordance with an exemplary embodiment.

FIGS. 1A through 1D schematically illustrate a process flow for forming a precision resistor in accordance with an exemplary embodiment. As illustrated in FIG. 1A, a resistor wire 101 is fabricated in the traditional manner. For example, resistor wire 101 may be patterned as part of a polycrystalline gate wire 102 or may be built into the substrate material. Resistor wire 101 may have a width W equal to a standard gate width, for example about 30 nanometers (nm) to about 50 nm, e.g., about 40 nm and a height H of about 40 nm to about 100 nm. The length $L_{wire}$ of resistor wire 101 may be at least 0.1 microns (µm).

Figure 1B:
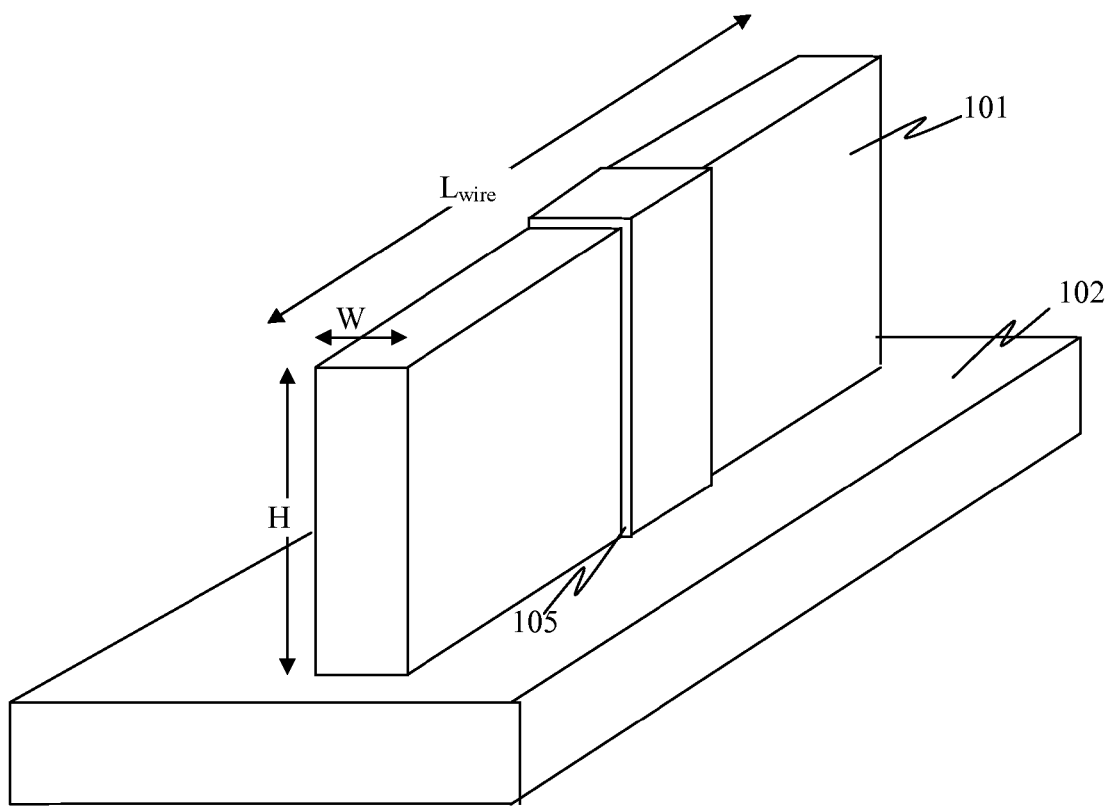
Figure 1C:
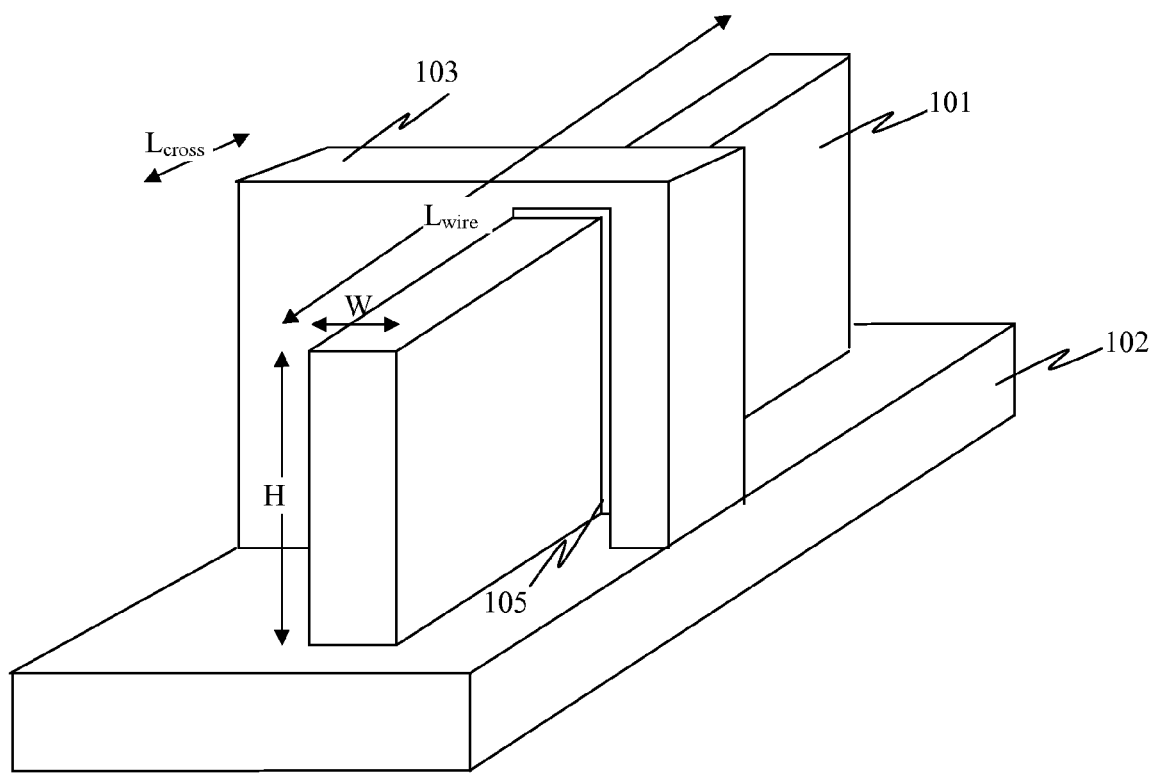
Figure 1D:
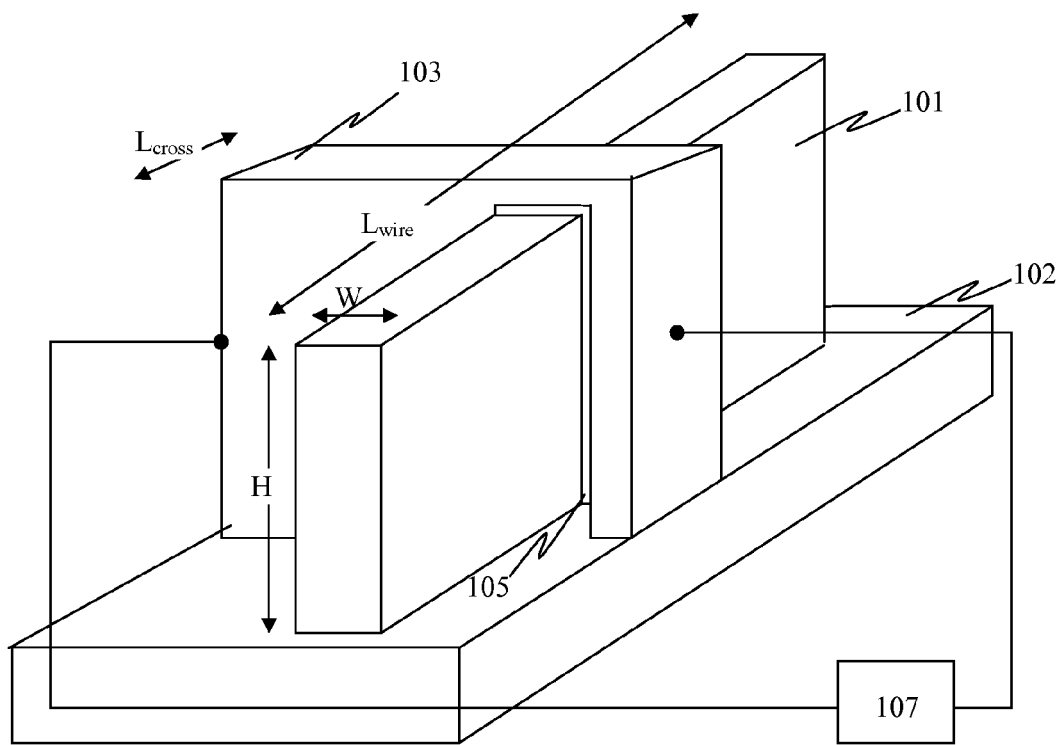

Adverting to FIGS. 1B and 1C, a control wire 103 may be patterned across resistor wire 101, wrapping around the top and sides, but electrically isolated from resistor wire 101. For example, a thin dielectric layer 105, i.e., having a thickness about 6 nm to about 20 nm, may separate control wire 103 from resistor wire 101. The width of control wire 103 and number of cross points between resistor 101 and control wire 103 may be varied, but the ideal total cross-point area should be minimized to limit the capacitance coupling of resistor wire 101 to control wire 103. Accordingly, $L_{cross}$ (the width of control wire 103 along the length of resistor wire 101) may range from about 20 nm to about 40 nm.

Control wire 103 may be formed through self-alignment of a contact layer to the gate line. By taking advantage of a self aligned stop layer for the contact etch, a contact wire 103 may be brought into intimate proximity of resistor wire 101 without risk of shorting in the vertical or horizontal directions. Alternatively, control wire 103 may be patterned as a separate gate wire or as part of a metal 1 pattern layer.

Figure 1E:
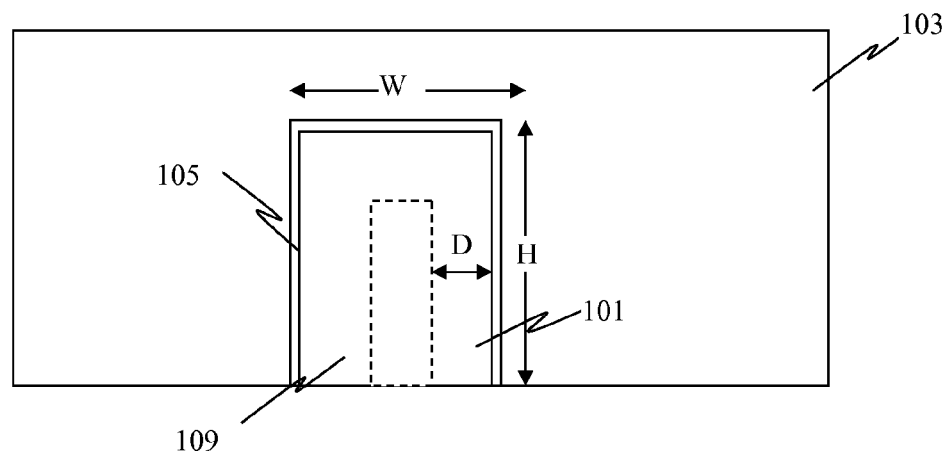
FIG. 1E is a cross-sectional view of the precision resistor of FIG. 1D.

Through voltage bias of control wire 103, for example via circuit 107 (illustrated in FIG. 1D), a local depletion channel 109 may be developed in the cross-section of resistor wire 101 under the control wire, as illustrated in FIG. 1E. By changing the depth D of the depletion channel, a short high-resistance wire may be placed in series with the rest of the resistor chain. Depth D is a function of the voltage bias between control wire 103 and resistor wire 101 and also depends on the thickness of dielectric 105. The voltage bias may be a typical Vdd, for example about 0.8 Volts (V) to about 5 V, e.g., about 1 V. D may be about 10 nm or less, e.g., about 5 nm or less.

As explained above, the intrinsic silicon resistance ρ is a function of temperature. Thus, the resistance of resistor 101 with no control wire would be $$R_{bulk} = \rho * \left(\frac{L_{wire}}{HW}\right) \quad \text{Eq. 1}$$

which varies with temperature. By adding control wire 103, the total resistance of the precision resistor becomes $$R_{tot} = R_{bulk} + R_{control} = \rho\left(\frac{(L_{wire} - L_{cross})}{HW} + \frac{L_{cross}}{(W - 2D)*(H - D)}\right), \quad \text{Eq. 2}$$

where Rcontrol may be set to compensate for the changes in Rbulk.

Using a comparator circuit for circuit 107, a voltage bias between resistor wire 101 and control wire 103 may be dynamically changed to dynamically tune the resistance, thereby allowing a total resistance of the precision resistor to change over time, or to allow for corrections in the bulk resistance to keep the total wire resistance constant.

The embodiments of the present disclosure can achieve several technical effects, including control of the resistance of a precision resistor. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a resistor, the method comprising:
    forming a resistive semiconductive element in a polycrystalline gate line, by patterning a portion of the polycrystalline gate line, the resistive semiconductive element having a width and a length, wherein the length and/or width of the resistive semiconductive element is less than a length and/or width, respectively, of the polycrystalline gate line;
    patterning an electrically conductive line across the width of the resistive semiconductive element, but electrically isolated therefrom; and
    forming a depletion channel in the resistive semiconductive element under the electrically conductive line to form a resistance in series with the resistive semiconductive element.

2. The method according to claim 1, comprising forming the depletion channel at a width of about 10 nm or less, but greater than zero, by applying a bias voltage to the electrically conductive line.

3. The method according to claim 2, further comprising:
    forming a dielectric layer, at a thickness of about 10 nm to about 20 nm, between the resistive semiconductive element and the electrically conductive line.

4. The method according to claim 1, comprising patterning the electrically conductive line by self aligning a contact layer to the gate line.

5. The method according to claim 1, comprising patterning the electrically conductive line as a separate gate wire.

6. The method according to claim 2, comprising forming a first metal pattern over a substrate, and patterning the electrically conductive line while forming the first metal pattern.

7. The method according to claim 2, comprising forming the electrically conductive line with a width of about 20 nm to about 40 nm along the length of the resistive semiconductive element.

8. A method of fabricating a semiconductor device comprising:

patterning a polycrystalline gate line on a substrate;

forming a resistive semiconductive element, having a width and a length, in the polycrystalline gate line, by patterning a portion of the polycrystalline gate line, wherein the width and/or length of the resistive semiconductor element is less than a width and/or length, respectively, of the polycrystalline gate line;

forming a dielectric layer to a thickness of about 10 nm to about 20 nm over the resistive semiconductive element;

self aligning a contact layer to the gate line, over the dielectric layer, to a width of about 20 nm to about 40 nm along the length of the resistive semiconductive element, thereby forming an electrically conductive line across the width of the resistive semiconductive element; and dynamically applying a bias voltage of about 0.8 V to about 5 V to the electrically conductive line to form a depletion channel to a width of about 10 nm or less in the resistive semiconductive element under the electrically conductive line, to dynamically control the resistance value of the resistive semiconductive element.

\* \* \* \* \*